(12) United States Patent
Choi

(10) Patent No.: US 9,817,086 B2
(45) Date of Patent: Nov. 14, 2017

(54) CPP-GMR SENSOR FOR ELECTRONIC COMPASS

(71) Applicant: Apple Inc., Cupertino, CA (US)

(72) Inventor: Hyuk J. Choi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/860,622

(22) Filed: Sep. 21, 2015

(65) Prior Publication Data

US 2017/0082698 A1 Mar. 23, 2017

(51) Int. Cl.
*H01L 29/82* (2006.01)
*G01R 33/09* (2006.01)
*H01L 43/10* (2006.01)
*H01L 43/12* (2006.01)

(52) U.S. Cl.
CPC .......... *G01R 33/093* (2013.01); *H01L 43/10* (2013.01); *H01L 43/12* (2013.01)

(58) Field of Classification Search
CPC .......... G11B 2005/3996; G11B 5/3909; G11B 5/3912; G11B 5/3906; G11B 5/3163; G11B 5/3932; G11B 5/3929; G11B 2005/0021; G11B 2005/0024; G11B 5/1278; G11B 5/398; G11B 5/314; G11B 5/3903; G11B 5/396; H01L 29/66462; H01L 29/2003; H01L 29/7787; H01L 29/7786; H01L 2924/00; H01L 29/1066; H01L 29/66431; H01L 29/778; H01L 29/41766; H01L 29/207; H01L 29/402; H01L 29/4236; H01L 27/1463
See application file for complete search history.

(56) References Cited

U.S. PATENT DOCUMENTS

2009/0201612 A1* 8/2009 Shimazawa ............ B82Y 10/00
360/245

* cited by examiner

*Primary Examiner* — Robert Bachner
(74) *Attorney, Agent, or Firm* — Fish & Richardson P.C.

(57) ABSTRACT

CPP-GMR sensors and methods for making them are disclosed. In an implementation, a CPP-GMR sensor comprises: a substrate; an antiferromagnetic (AFM) layer formed on the substrate; a magnetic pin layer formed on the AFM layer; a first wire electrically coupled to the pin layer; a non-magnetic spacer layer formed on the pin layer, the spacer layer insulated from the first wire by electrical insulation material; a sensing layer formed on the spacer layer; a protective layer formed on the sensing layer; and a second wire formed on the protective layer, the second wire electrically coupled to the first wire through the protective layer, the sensing layer, the spacer layer and the pin layer.

20 Claims, 6 Drawing Sheets

CPP-GMR SENSOR FOR ELECTRONIC COMPASS

TECHNICAL FIELD

This disclosure relates generally to giant magnetoresistance (GMR) sensors.

BACKGROUND

GMR is a quantum mechanical magnetoresistance effect observed in thin-film structures composed of adjacent ferromagnetic and non-magnetic conductive layers. Magnetization of the adjacent ferromagnetic layers causes a change in the electrical resistivity of the GMR structure. The magnetization direction can be controlled by applying an external magnetic field to the GMR structure. Electric current can flow through the magnetic super lattice of the GMR structure using two different geometries. In a current-in-plane (CIP) geometry, the current flows in the plane of the layers. In a current-perpendicular-to-plane (CPP) configuration, the current flows perpendicular to the plane of the layers.

Modern mobile devices (e.g., smart phones) often include an electronic compass to determine a user's direction of travel. Some conventional electronic compasses use CIP-GMR sensors to sense external magnetic fields. Because CIP-GMR sensors have a maximum GMR effect of about 15%, the dynamic range, sensitivity and signal-to-noise ratio (SNR) of CIP-GMR sensors may be too low for some electronic compass applications.

SUMMARY

CPP-GMR sensors and methods for making them are disclosed.

In an implementation, a CPP-GMR sensor comprises: a substrate; an antiferromagnetic (AFM) layer formed on the substrate; a magnetic pin layer formed on the AFM layer; a first wire electrically coupled to the pin layer; a non-magnetic spacer layer formed on the pin layer, the spacer layer insulated from the first wire by electrical insulation material; a sensing layer formed on the spacer layer; a protective layer formed on the sensing layer; and a second wire formed on the protective layer, the second wire electrically coupled to the first wire through the protective layer, the sensing layer, the spacer layer and the pin layer.

In another implementation, a sensor system comprises: a first current-CPP-GMR sensor comprising: a first substrate; a first AFM layer formed on the first substrate; a first magnetic pin layer formed on the first AFM layer; a first wire electrically coupled to the first pin layer; a first non-magnetic spacer layer formed on the first pin layer, the first spacer layer insulated from the first wire by insulation material; a first sensing layer formed on the first spacer layer; a first protective layer formed on the first sensing layer; and a second wire formed on the first protective layer, the second wire electrically coupled to the first wire through the first pin layer, the first space layer, the first sensing layer and the first protective layer. The sensor system further includes: a second CPP-GMR sensor comprising: a second substrate; a second AFM layer formed on the second substrate; a second magnetic pin layer formed on the second AFM layer; a third wire electrically coupled to the second pin layer and to the first wire of the first sensing structure; a second non-magnetic spacer layer formed on the second pin layer, the second spacer layer insulated from the third wire by insulation material; a second sensing layer formed on the second spacer layer; a second protective layer formed on the second sensing layer; and a fourth wire formed on the second protective layer, the fourth wire electrically coupled to the second wire of the first sensor structure and the third wire through the second pin layer, the second space layer, the second sensing layer and the second protective layer.

In yet another implementation, a method of fabricating a CPP-GMR sensor comprises: forming an AFM layer on a substrate; forming a magnetic pin layer on the AFM layer; forming a non-magnetic spacer layer on the pin layer; forming a sensing layer on the spacer layer; forming a protective layer on the sensing layer; forming a sensor stack from the layers; forming first electrical insulation material on exposed regions of the substrate at least partially surrounding the sensor stack; forming a wire on the first electrical insulation material, the wire electrically coupled to the pin layer in the stack; and forming a second electrical insulation material over the wire, the second insulation material electrically insulating the wire from the spacer layer of the sensor stack.

In yet another implementation, a method of fabricating a CPP-GMR sensor comprises: forming an AFM layer on a substrate; forming first electrical insulation material on exposed regions of the substrate at least partially surrounding the sensor stack; forming a magnetic pin layer on the AFM layer; forming a non-magnetic spacer layer on the pin layer; forming a sensing layer on the spacer layer; forming a protective layer on the sensing layer; forming a sensor stack from the layers; forming a wire on the pin layer, the wire electrically coupled to the pin layer in the stack; and forming a second electrical insulation material over the wire, the second insulation material electrically insulating the wire from the spacer layer of the sensor stack.

Particular implementations disclosed herein provide one or more of the following advantages. The CPP-GMR sensors for electronic compass applications disclosed herein provide a GMR effect that is higher than CIP-GMR sensors enabling a full scale range to be increased in proportion to the GMR effect. Higher GMR effect can also be used to increase sensitivity to external magnetic fields and SNR. Additionally, the change in resistivity has almost linear dependence on the external magnetic field over a large field range.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Figure 1:
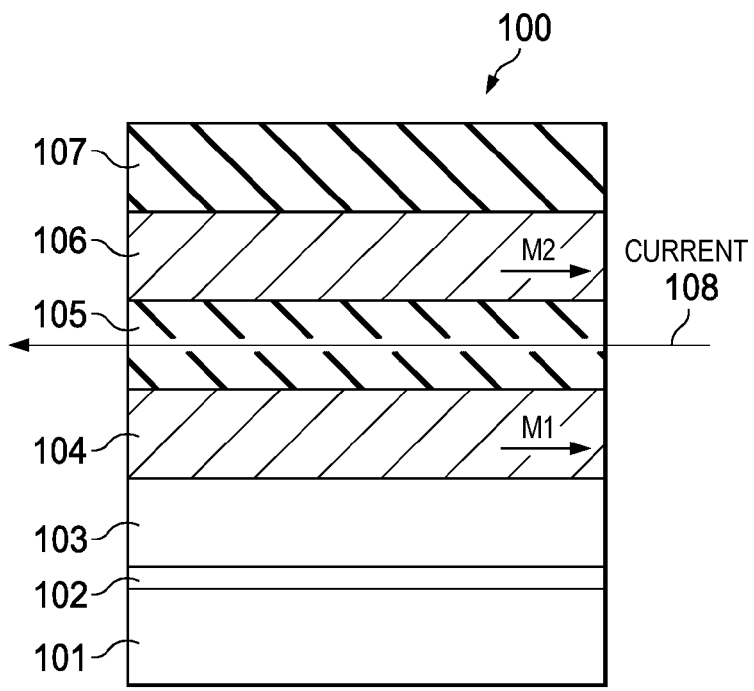
FIG. 1 is a cross-section view of a prior art CIP-GMR sensor.

FIG. 1 is a cross-section view of a prior art CIP-GMR sensor 100. CIP-GMR 100 sensor includes silicon substrate 101, binder layer 102, antiferromagnetic (AFM) layer 103, pin layer 104, non-magnetic spacer layer 105, sensing layer 106 and protective layer 107. In sensing layer 106, magnetization direction M2 can be reoriented by an external magnetic field. The initial magnetization direction M2 is defined by the magnetization direction M1 in pin layer 104, which is made of a magnetic material. Protection layer 107 protects the sensor stack from the environment. Current path 108 is in the plane of the layers and extends through spacer layer 105.

The change in resistivity of CIP-GMR sensor 100 when exposed to an external magnetic field is proportional to cos θ, where θ is the in-plane angle between M1 of pin layer 104 and M2 of sensing layer 106. This change in resistivity is due to spin-dependent scattering at the interface between spacer layer 105 and pin layer 104 and spacer layer 105 and sensing layer 106. The maximum GMR effect (ΔR/R) for CIP-GMR sensor 100 is about 15%.

Figure 2:
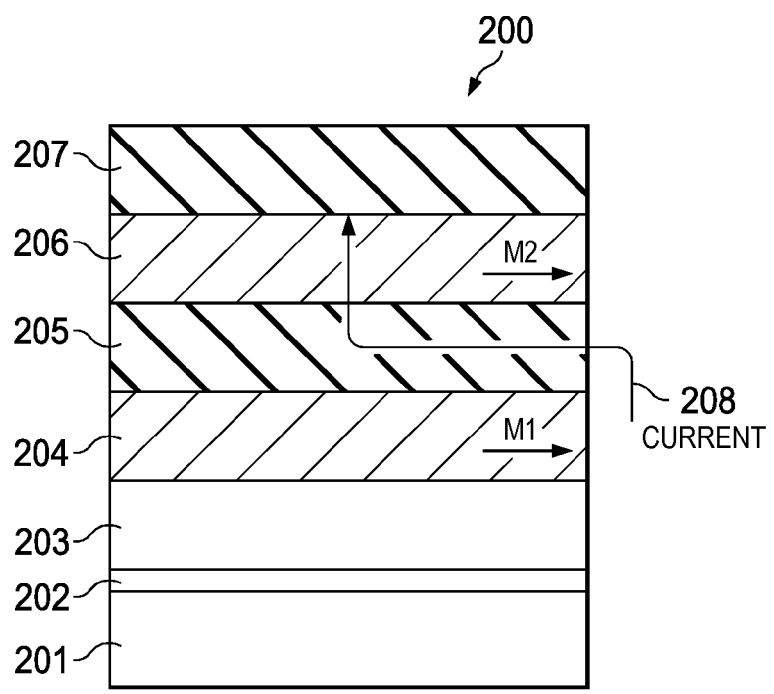
FIG. 2 is a cross-section view of an example CPP-GMR sensor.

FIG. 2 is a cross-section view of an example CPP-GMR sensor 200. CPP-GMR sensor 200 includes silicon substrate 201, binder layer 202, AFM layer 203, pin layer 204, non-magnetic spacer layer 205, sensing layer 206 and protective layer 207. In sensing layer 206, magnetization direction M2 can be reoriented by an external magnetic field. The initial magnetization direction M2 is defined by the magnetization direction M1 in pin layer 204, which is made of a magnetic material. Protection layer 207 protects the sensor stack from the environment. Current path 208 enters pin layer 204 and is perpendicular to the plane of the layers.

The change in resistivity of CPP-GMR sensor 200 is due to spin dependent scattering inside pin layer 204 and sensing layer 206. The maximum GMR effect (ΔR/R) for CPP-GMR sensor 200 is about 30%-50%. The higher maximum GMR effect can be used to improve one or more parameters of the sensor by controlling the shape anisotropy which can be modified by the printed shape of the GMR sensor. For example, the full scale range can be increased roughly in proportion to ΔR/R. Higher ΔR/R can also be used to increase sensitivity and SNR. The mechanism for sensing is the same as CIP-GMR sensor 100 except for the current path 208 which is perpendicular to the plane of the layers. The change in resistivity ΔR has almost linear dependence on the external magnetic field over a large field range.

There are several technical challenges in fabricating CPP-GMR sensor 200. First, current must be injected into pin layer 204 to obtain the higher ΔR/R. If the current is injected through AFM layer 203 or below, the ΔR/R advantage over CIP-GMR disappears. To address this first technical challenge, CPP-GMR sensor 200 is fabricated so that current is injected into pin layer 204, as described in reference to FIGS. 3A-3D and 4A-4E.

An additional technical challenge is that total resistance of the CPP-GMR sensor is significantly reduced in comparison to the CIP-GMR sensor as the GMR stack thickness is very thin (~20 nm), whereas the sensor lateral dimensions can be in the μm range. Lower total resistance means higher measurement current thus higher power consumption. Also, low resistance of the sensor element means the GMR effect ΔR/R will be reduced as it becomes $\Delta R_{sensor}/(R_{sensor}+R_{rest\ of\ circuit})$. To address this second technical challenge, multiple small CPP-GMR sensors can be connected in series, as described in reference to FIGS. 3D and 4E.

FIGS. 3A-3D is an example process for fabricating CPP-GMR sensor 200. Note that the figures are not drawn to scale and the wire build up steps are skipped for simplicity.

Figure 3A:
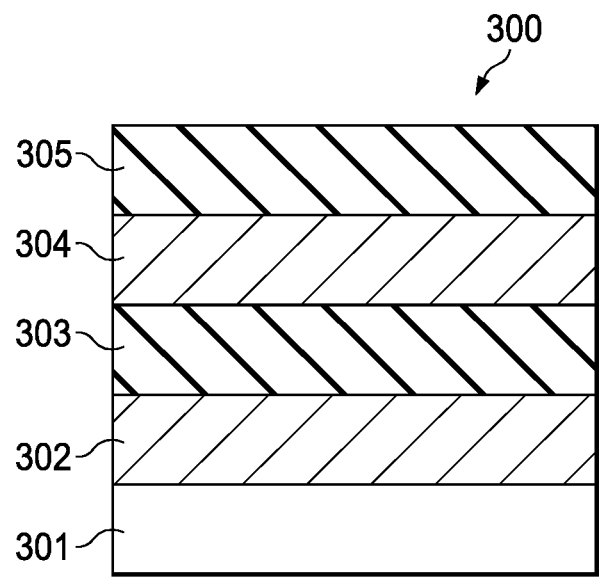
FIGS. 3A-3D is an example process for fabricating a CPP-GMR sensor.
Figure 3B:
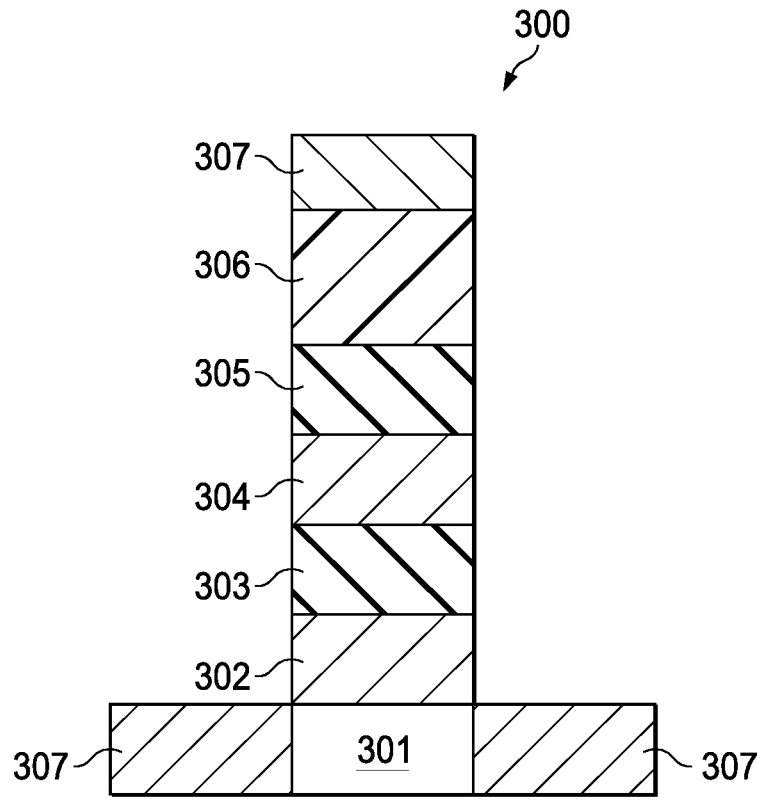

Referring to FIG. 3A, the process begins by depositing on a silicon substrate (not shown) AFM layer 301, pin layer 302, non-magnetic spacer layer 303, sensing layer 304 and protective layer 305 (also referred to as "capping" layer). In some implementations, protective layer 305 can be made of tantalum or Ru, non-magnetic spacer layer 303 can be made of copper, sensing layer 304 can be made of NiFe or cobalt alloys, AFM layer 301 can be made of IrMn or PtMn and pin layer 302 can be made of CoFe.

A first photoresist layer is deposited on protective layer 305, which is then patterned using a mask to define open areas. After the photoresist material is developed using photo-lithography technology, the structure is milled down to AFM layer 301 thereby defining CPP-GMR sensor stack 300. The milling is followed by a first deposition of electrical insulation material 307 (e.g., Alumina), resulting in the structure shown in FIG. 3B. A mass spectrometer can be used during the mill process to precisely control the mill depth, which in turn, allows accurate alignment of AFM layer 301 and electrical insulation material 307.

Figure 3C:
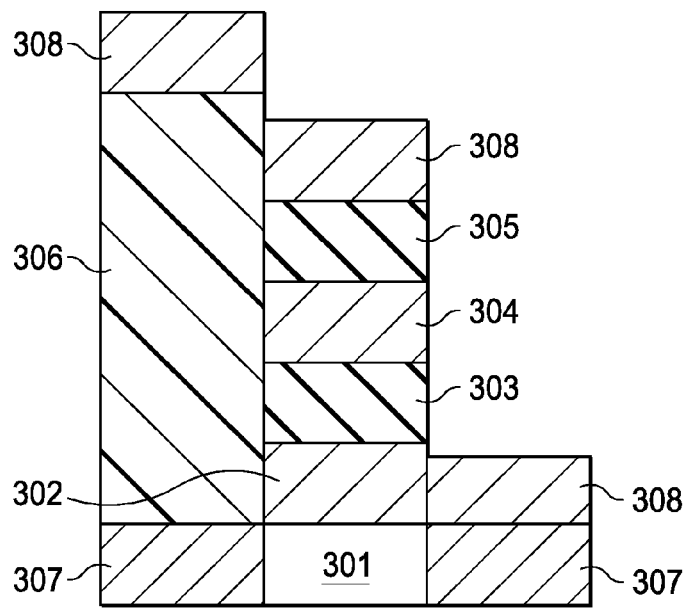

Next, the first photoresist layer is lifted off and a second photoresist layer 306 is applied and patterned on the structure, which is followed by wire deposition. The resulting structure is shown in FIG. 3C. In the wire deposition step it is important to get a good electrical connection between pin layer 302 and wire 308. A side cleaning mill can be performed on the structure before wire deposition is performed to ensure a good electrical connection. In some implementations, shorting between spacer layer 303 and wire 308 can be avoided by ensuring that the thickness of wire 308 is less than the thickness of pin layer 302. In some implementations, to reduce the resistance of the wire, the thickness of the wire can be made much thicker away from the interface between the pin layer 302 and wire 308.

Figure 3D:
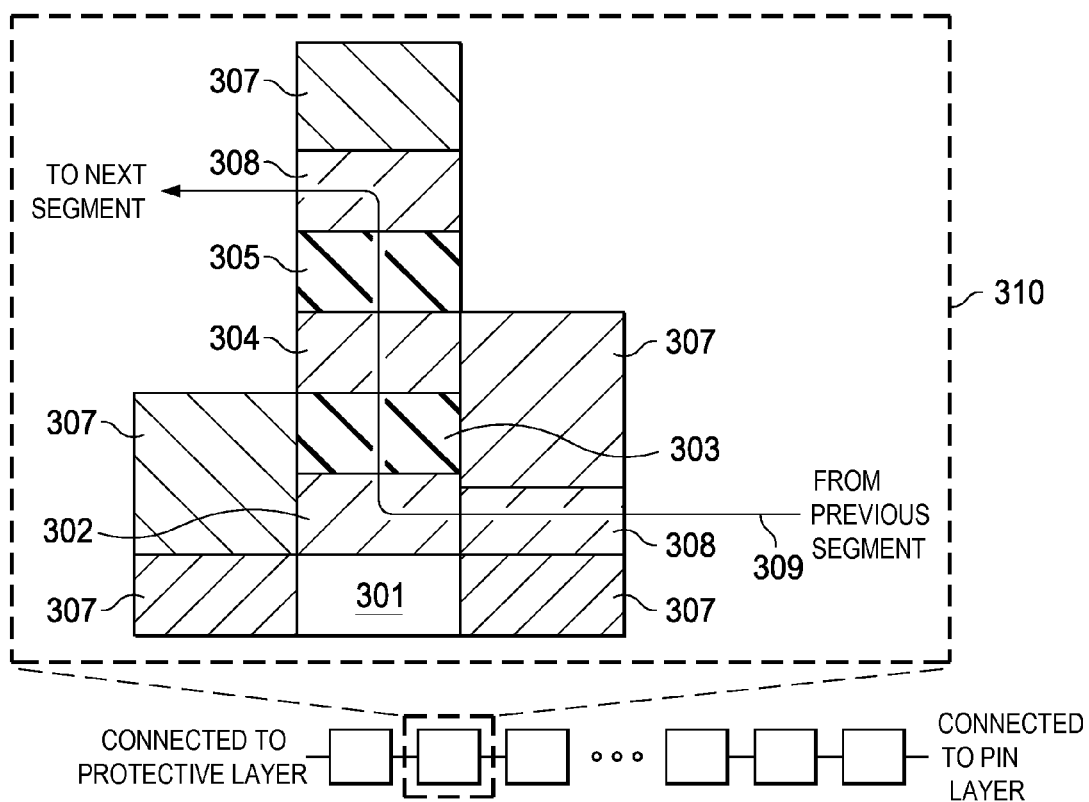

After wire deposition, the second photoresist layer 306 is lifted off and a second deposition of electrical insulation material 307 (e.g., Alumina) is performed, resulting in CPP-GMR sensor 310 shown in FIG. 3D. This final deposition leaves deposits of electrical insulation material 307 over wire 308 at the pin layer interface and protection layer 305. Care should be taken to ensure there is no shorting between spacer layer 303 and wire 308. A side cleaning mill before the second deposition of electrical insulation material 307 can help remove any residues. The resulting CPP-GMR sensor 310 has wire 308 interfaced with pin layer 302, providing current path 309 through CPP-GMR sensor 310 (perpendicular to plane) and exiting on top of protective layer 305.

To increase the total resistance of CPP-GMR sensor 310, multiple prints of CPP-GMR sensor 310 can be coupled together in series, where a previous CPP-GMR sensor 310 segment in the series is coupled to wire 308 at the pin layer interface and a next CPP-GMR sensor 310 segment in the series is coupled to wire 308 on top of protective layer 305, as shown in FIG. 3D.

FIGS. 4A-4E is an example alternative process for fabricating CPP-GMR sensor 200. Note that the figures are not drawn to scale and the wire build up steps are skipped for simplicity.

Figure 4A:
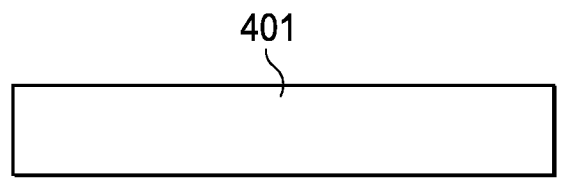
FIGS. 4A-4E is an example alternative process for fabricating a CPP-GMR sensor.
Figure 4B:
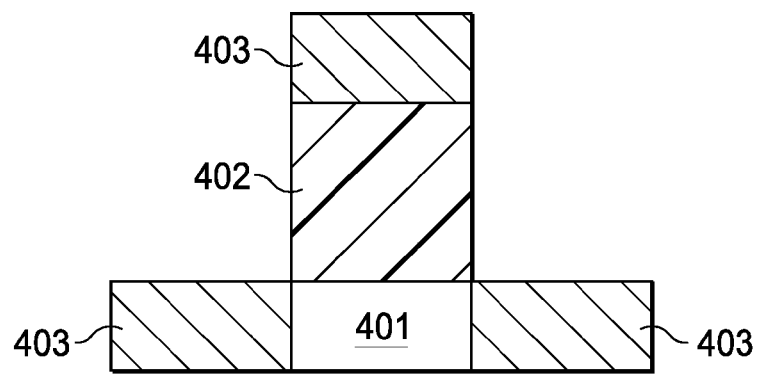
Figure 4C:
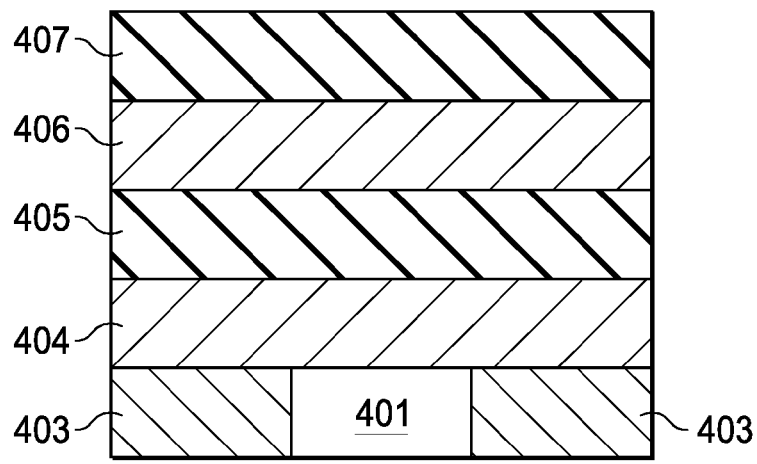

Referring to FIG. 4A, the process begins by depositing AFM layer 401 on a silicon substrate (not shown). A first photoresist layer 402 is applied on AFM layer 401, which is patterned with a mask to define open areas. After the photoresist material is developed using photo-lithography technology, the structure is milled down to the substrate. The milling is followed by a first deposition of an electrical insulation material 403 (e.g., Alumina), as shown in FIG. 4B. The first photoresist layer 402 is lifted off, which is followed by depositing of pin layer 404, spacer layer 405, sensing layer 406 and protective layer 407, resulting in the structure shown in FIG. 4C. Note that a strong coupling between pin layer 404 and AFM layer 401 is desired. A gentle mill maybe needed before deposition of layers 404-407 or a thin layer of AFM deposition can be added before deposition of layers 404-407.

Figure 4D:
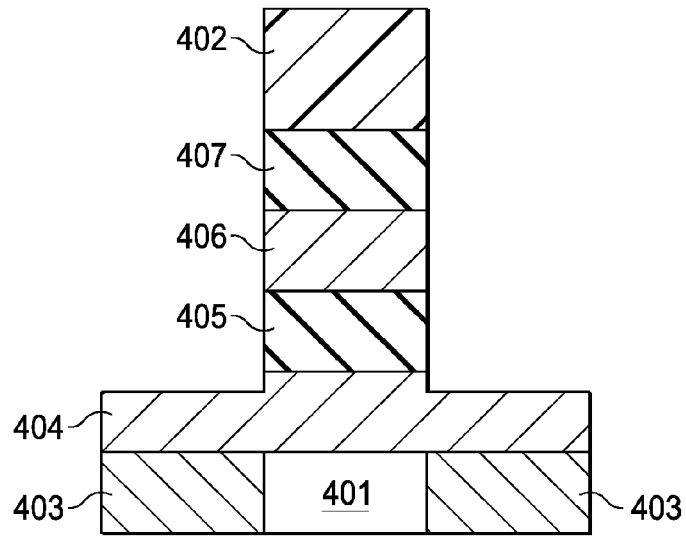

Next, a second photoresist layer 402 can be applied on the structure and patterned using a mask to define open areas. After the photoresist material is developed the structure can be milled down to pin layer 404, as shown in FIG. 4D. In some implementations, a slight over mill can be performed so that electrical insulation material 403 can extend partially into pin layer 404. A mass spectrometer can be used to monitor which layer is being milled.

Next, connecting wires 410 are deposited, followed by a second deposition of electrical insulation layer 403 (e.g., Alumina) to electrically insulate wire 410 at the pin layer interface and on top of protective layer 407. The resulting CPP-GMR sensor 411 has wire 410 interfaced with pin layer 404, providing current path 409 through CPP-GMR sensor 411 (perpendicular to plane) and exiting on top of protective layer 407.

Figure 4E:
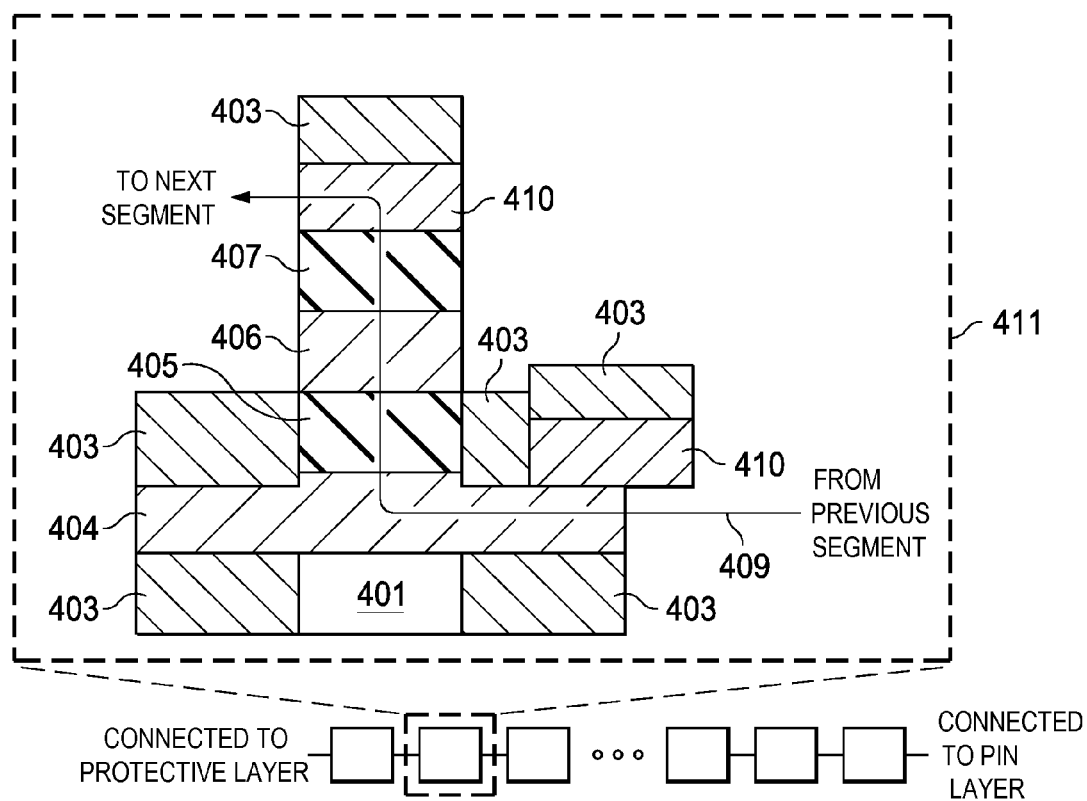

To increase the total resistance of CPP-GMR sensor 411, multiple prints of CPP-GMR sensor 411 can be coupled together in series, where a previous CPP-GMR sensor segment is coupled to pin layer 404 and a next CPP-GMR sensor 411 segment is coupled to wire 410 on top of protective layer 407, as shown in FIG. 4E.

Figure 5A:
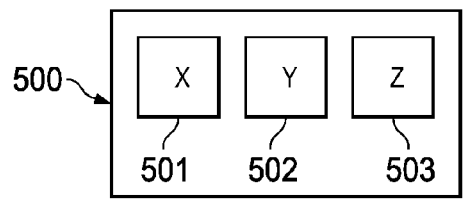
FIG. 5A-5B illustrate the use of CPP-GMR sensor in an electronic compass.
Figure 5B:
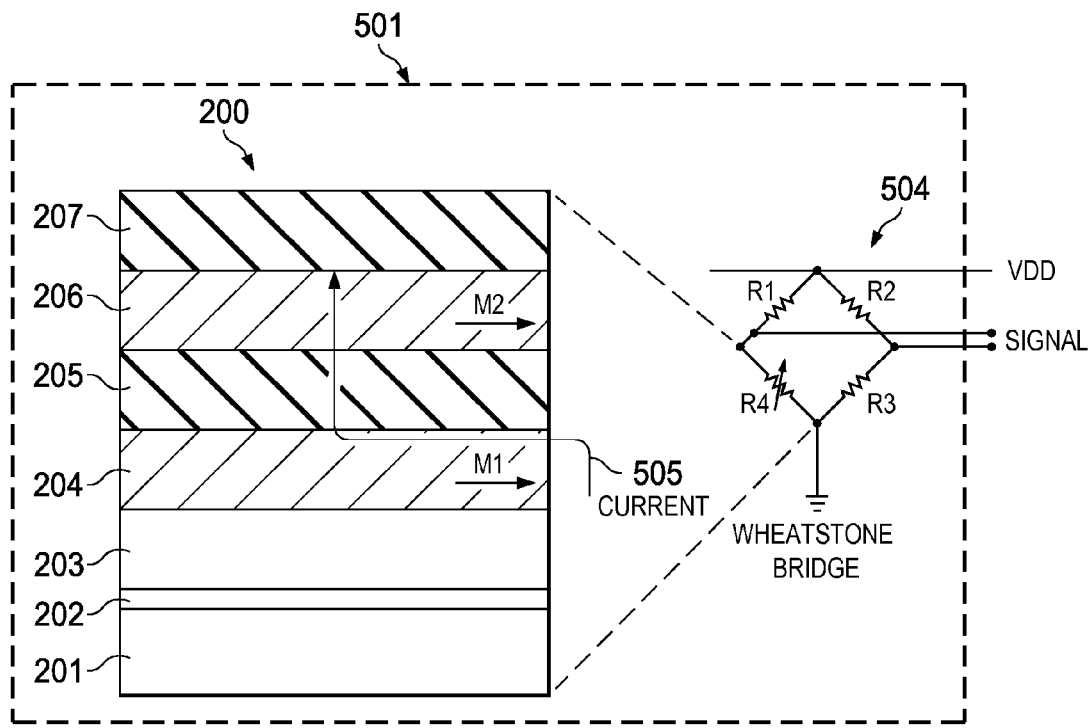

FIGS. 5A-5B illustrate the use of CPP-GMR sensors in an electronic compass. Referring to FIG. 5A, in some implementations, three CPP-GMR sensors 501, 502, 503 can be mounted on circuit board 500 so that they sense an external magnetic field along three mutually orthogonal axes X, Y, Z of a reference coordinate frame. Each CPP-GMR sensor 501, 502, 503 can be coupled to signal generating circuitry 504 for generating a signal in response to a change in resistivity of the CPP-GMR sensor. In the example shown, each CPP-GMR sensor is coupled to a Wheatstone bridge and generates current 505 that is proportional to the change in resistivity of the CPP-GMR sensor. In another implementation, each of the resisters in the Wheatstone bridge can be made of CPP-GMR sensors, and pairs of resistors (e.g., R1-R3, R2-R4) can respond in opposite directions to generate a voltage signal that is proportional to the external magnetic field being measured. The signal can be routed to additional circuitry on, for example, an application specific integrated circuit (ASIC) where the signal can be further processed. The processed signal can be output to a host processor where it can be used in an electronic compass application to enable an apparatus (e.g., smart phones, wearable computers, vehicle navigation systems) to determine a direction of travel of the apparatus.

Figure 6:
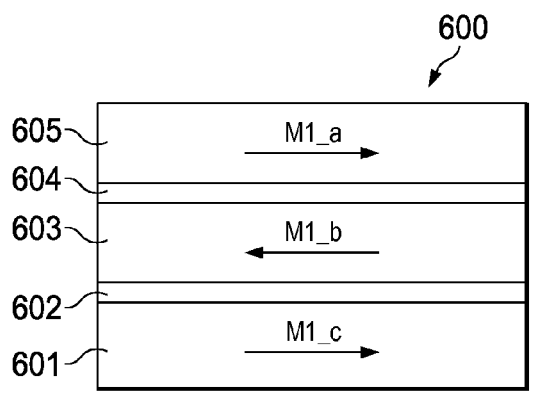
FIG. 6 illustrates an alternate pin layer structure.

FIG. 6 illustrates an alternate pin layer structure. In an implementation, the pin layer shown in FIGS. 2, 3D and 4D can be replaced with a multilayer structure 600, which may be easier to process (because it is physically thicker) while maintaining the magnetization direction in-plane. For example, magnetic layers 601, 603, 605 of structure 600 can have a thickness of about 20-30 Å of Cobalt-Iron (CoFe) alloy and antiferromagnetic coupling layers 602, 604 can be about 8+/−1 Å of Ruthenium (Ru). Coupling layers 602, 604 ensure that the magnetic layers on either side are strongly magnetically coupled in opposite directions. For example, magnetic layers 601, 603 are magnetically coupled by coupling layer 602 in opposite directions and magnetic layers 603, 605 are magnetically coupled in opposite directions by coupling layer 604.

While this document contains many specific implementation details, these details should not be construed as limitations on the scope of what may be claimed but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A current-perpendicular-to-plane, giant magnetoresistance (CPP-GMR) sensor comprising:
   a substrate;
   an antiferromagnetic (AFM) layer formed on the substrate;
   a magnetic pin layer formed on the AFM layer;
   a first wire electrically coupled to the pin layer;
   a non-magnetic spacer layer formed on the pin layer, the non-magnetic spacer layer insulated from the first wire by electrical insulation material;
   a sensing layer formed on the non-magnetic spacer layer;
   a protective layer formed on the sensing layer; and
   a second wire formed on the protective layer, the second wire electrically coupled to the first wire through the protective layer, the sensing layer, the non-magnetic spacer layer and the pin layer.

2. The sensor of claim 1, further comprising:
   a signal generating circuit coupled to the first wire or the second wire and configured to generate a signal in response to change in resistivity due to spin dependent scattering inside the pin layer and sensing layer.

3. The sensor of claim 2, wherein the signal is electric current and the electric current changes in response to the change in resistivity.

4. The sensor of claim 1, wherein the pin layer is a multi-layer structure comprising:
   a first magnetic layer having a first magnetization direction;
   a first coupling layer formed on the first magnetic layer;
   a second magnetic layer formed on the first coupling layer and having a second magnetization direction;
   a second coupling layer formed on the second magnetic layer; and
   a third magnetic layer formed on the second coupling layer and having a third magnetization direction, wherein the first and third magnetization directions are the same and the second magnetization direction is opposite the first and third magnetization directions.

5. The sensor of claim 4, wherein the first and second coupling layers keeps the second magnetization direction opposite to the first and third magnetization directions.

6. The sensor of claim 1, where a thickness of the first wire is less than a thickness of the pin layer.

7. The sensor of claim 6, wherein the first wire and the insulation material interface with the pin layer and the insulation material occupies a portion of the interface that is adjacent to the non-magnetic spacer layer.

8. The sensor of claim 6, wherein the first wire is formed on insulation material and a first portion of the first wire interfaces with the pin layer and second portion of the first wire interfaces with the AFM layer.

9. The sensor of claim 6, wherein the first wire is formed on the pin layer and is insulated from the non-magnetic spacer layer by insulation material formed on the pin layer between the first wire and the non-magnetic spacer layer.

10. A sensor system comprising:
a first current-perpendicular-to-plane giant magnetoresistance (CPP-GMR) sensor comprising:
  a first substrate;
  a first antiferromagnetic (AFM) layer formed on the first substrate;
  a first magnetic pin layer formed on the first AFM layer;
  a first wire electrically coupled to the first pin layer;
  a first non-magnetic spacer layer formed on the first pin layer, the first non-magnetic spacer layer insulated from the first wire by insulation material;
  a first sensing layer formed on the first non-magnetic spacer layer;
  a first protective layer formed on the first sensing layer; and
  a second wire formed on the first protective layer, the second wire electrically coupled to the first wire through the first pin layer, the first non-magnetic spacer layer, the first sensing layer and the first protective layer;
a second CPP-GMR sensor comprising:
  a second substrate;
  a second AFM layer formed on the second substrate;
  a second magnetic pin layer formed on the second AFM layer;
  a third wire electrically coupled to the second pin layer and to the first wire of the first sensing layer;
  a second non-magnetic spacer layer formed on the second pin layer, the second non-magnetic spacer layer insulated from the third wire by insulation material;
  a second sensing layer formed on the second non-magnetic spacer layer;
  a second protective layer formed on the second sensing layer; and
  a fourth wire formed on the second protective layer, the fourth wire electrically coupled to the second wire of the first sensing layer and the third wire through the second pin layer, the second non-magnetic space layer, the second sensing layer and the second protective layer.

11. The sensor system of claim 10, further comprising:
a signal generating circuit electrically coupled to at least one of the first, second, third or fourth wire and configured to generate a signal in response to change in resistivity of the first and second CPP-GMR sensors due to spin dependent scattering inside the first pin layer and first sensing layer and the second pin layer and second sensing layer.

12. The sensor system of claim 11, wherein the signal is electric current and the electric current changes in response to the change in resistivity.

13. The sensor system of claim 10, wherein the first or second pin layer is a multi-layer structure comprising:
  a first magnetic layer having a first magnetization direction;
  a first coupling layer formed on the first magnetic layer;
  a second magnetic layer formed on the first coupling layer and having a second magnetization direction;
  a second coupling layer formed on the second magnetic layer; and
  a third magnetic layer formed on the second coupling layer and having a third magnetization direction, wherein the first and third magnetization directions are the same and the second magnetization direction is opposite the first and third magnetization directions.

14. The sensor system of claim 13, wherein the first and second coupling layers keeps the second magnetization direction opposite to the first and third magnetization directions.

15. The sensor system of claim 10, wherein the first and second CPP-GMR sensors share a common substrate.

16. An apparatus comprising:
two or more current-perpendicular-to-plane giant magnetoresistance (CPP-GMR) sensors coupled in series, wherein each of the CPP-GMR sensors in the series comprises:
  a substrate;
  an antiferromagnetic (AFM) layer formed on the substrate;
  a magnetic pin layer formed on the AFM layer;
  a first wire electrically coupled to the pin layer;
  a non-magnetic spacer layer formed on the pin layer, the non-magnetic spacer layer insulated from the first wire by electrical insulation material;
  a sensing layer formed on the non-magnetic spacer layer;
  a protective layer formed on the sensing layer; and
  a second wire formed on the protective layer, the second wire electrically coupled to the first wire through the protective layer, the sensing layer, the non-magnetic spacer layer and the pin layer,
  the first wire is coupled to the protective layer of a preceding CPP-GMR in the series and the second wire is coupled to the magnetic pin layer of a next CPP-GMR in the series;
a signal generating circuit coupled to at least one of the CPP-GMR sensors, the signal generating circuit configured to generate a signal in response to changes of resistivity in at least one of the CPP-GMR sensors; and
a processor coupled to the signal generating circuit, the processor configured to determine a direction of travel of the apparatus based on the signal.

17. The apparatus of claim 16, wherein the signal is electric current and the electric current changes in response to the change in resistivity.

18. The apparatus of claim 16, wherein the pin layer is a multi-layer structure comprising:
  a first magnetic layer having a first magnetization direction;
  a first coupling layer formed on the first magnetic layer;
  a second magnetic layer formed on the first coupling layer and having a second magnetization direction;
  a second coupling layer formed on the second magnetic layer; and
  a third magnetic layer formed on the second coupling layer and having a third magnetization direction, wherein the first and third magnetization directions are the same and the second magnetization direction is opposite the first and third magnetization directions.

19. The apparatus of claim 16, where a thickness of the first wire is less than a thickness of the pin layer.

20. The apparatus of claim 16, wherein the first wire and the insulation material interface with the pin layer and the insulation material occupies a portion of the interface that is adjacent to the non-magnetic spacer layer.

* * * * *